(12) United States Patent
Liang et al.

(10) Patent No.: US 10,978,873 B2
(45) Date of Patent: Apr. 13, 2021

(54) METHOD AND ENERGY METERING DEVICE FOR ADAPTING GREEN ENERGY CONSUMPTION IN ENERGY CONSUMING DEVICES

(71) Applicant: Telefonaktiebolaget LM Ericsson (publ), Stockholm (SE)

(72) Inventors: Hongxin Liang, Väsby (SE); Harald Edquist, Stockholm (SE); Jens Malmodin, Norrtälje (SE); Maxim Teslenko, Sollentuna (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 288 days.

(21) Appl. No.: 16/082,486

(22) PCT Filed: Mar. 9, 2016

(86) PCT No.: PCT/SE2016/050189
§ 371 (c)(1),
(2) Date: Sep. 5, 2018

(87) PCT Pub. No.: WO2017/155437
PCT Pub. Date: Sep. 14, 2017

(65) Prior Publication Data
US 2019/0097424 A1 Mar. 28, 2019

(51) Int. Cl.
*H02J 3/14* (2006.01)
*G06Q 50/06* (2012.01)
(Continued)

(52) U.S. Cl.
CPC ............ *H02J 3/14* (2013.01); *G01R 19/2513* (2013.01); *G06Q 10/06* (2013.01); *G06Q 50/06* (2013.01);
(Continued)

(58) Field of Classification Search
CPC .. H02J 3/14; H02J 13/00006; H02J 13/00004; H02J 13/0017; H02J 2310/14;
(Continued)

(56) References Cited

U.S. PATENT DOCUMENTS 9,727,036 B2 * 8/2017 Taniguchi .............. G06Q 50/06
10,103,546 B2 * 10/2018 Stanton .................. G06Q 10/06
(Continued)

FOREIGN PATENT DOCUMENTS

GB 2483304 A 3/2012

OTHER PUBLICATIONS

International Search Report and Written Opinion dated Aug. 17, 2016 issued in International Application No. PCT/SE2016/050189. (10 pages).

*Primary Examiner* — Ramesh B Patel
(74) *Attorney, Agent, or Firm* — Patent Portfolio Builders, PLLC

(57) ABSTRACT

An energy metering device (16) measures the energy consumption of a group of energy consuming devices (18, 20, 22), compares the measured energy consumption with an energy consumption threshold representing a level below which renewable sources are used for the generation of energy and indicates (I) to energy consuming devices (18, 20) of the group if the measured energy consumption is on one of the two sides of the energy consumption threshold. An energy consuming device (18) receives an indication (I), investigates if the energy consumption has crossed the energy consumption threshold using received indications and adjusts an own current energy consumption if it has.

19 Claims, 5 Drawing Sheets

(51) Int. Cl.
*H02J 13/00* (2006.01)
*G01R 19/25* (2006.01)
*G06Q 10/06* (2012.01)
*G01D 4/00* (2006.01)

(52) U.S. Cl.
CPC ............ *H02J 13/0017* (2013.01); *G01D 4/00* (2013.01); *H02J 2310/14* (2020.01); *Y02B 70/30* (2013.01); *Y02B 70/3225* (2013.01); *Y02B 90/20* (2013.01); *Y04S 20/222* (2013.01); *Y04S 20/242* (2013.01); *Y04S 20/30* (2013.01)

(58) Field of Classification Search
CPC .... G06Q 10/06; G06Q 50/06; G01R 19/2513; G01D 4/00; Y04S 20/222; Y04S 20/242; Y04S 20/30; Y02B 70/3225; Y02B 70/30; Y02B 90/20
See application file for complete search history.

(56) References Cited

U.S. PATENT DOCUMENTS

| | | | |
|---|---|---|---|
| 2010/0094476 A1* | 4/2010 | Hamilton, II | H02J 3/14 700/295 |
| 2012/0059531 A1* | 3/2012 | Marivoet | H02J 13/0017 700/296 |
| 2012/0245744 A1* | 9/2012 | Prosser | H02J 3/32 700/286 |
| 2014/0172503 A1* | 6/2014 | Hammerstrom | G06Q 50/06 705/7.31 |
| 2015/0372485 A1* | 12/2015 | Borean | H02J 3/00 700/275 |
| 2016/0141873 A1* | 5/2016 | Ellice-Flint | H02J 3/38 307/20 |
| 2017/0005515 A1* | 1/2017 | Sanders | H02J 3/32 |
| 2017/0256949 A1* | 9/2017 | Stanton | G06Q 10/06 |
| 2018/0294647 A1* | 10/2018 | Borean | G05B 19/042 |

* cited by examiner

METHOD AND ENERGY METERING DEVICE FOR ADAPTING GREEN ENERGY CONSUMPTION IN ENERGY CONSUMING DEVICES

CROSS REFERENCE TO RELATED APPLICATION(S)

This application is a 35 U.S.C. § 371 National Stage of International Patent Application No. PCT/SE2016/050189, filed Mar. 9, 2016, designating the United States.

TECHNICAL FIELD

The invention relates to the supply of energy to a group of energy consuming devices. More particularly, the invention relates to a method, energy metering device, computer program and computer program product for allowing energy consuming devices in a group of energy consuming devices to adapt to green energy consumption, a method, energy consuming device, computer program and computer program product for adapting to green energy consumption as well as to an energy consuming system for allowing energy consuming devices to adapt to a green energy consumption.

BACKGROUND

A household or a company can be connected to a power supply grid in order to be supplied with energy from an electric retailer or power supplier for powering a number of energy consuming devices in the household or company. Such a combination of energy consuming devices may then be considered to form an energy consuming system.

Today when signing up a contract with an electricity retailer or power supplier, it is possible for a user having such an energy consuming system to choose a percentage of the electricity that should be green, meaning it is generated from for example solar, wind, rain, tides, waves, geothermal heat or other renewable energy sources. The incentive here is to encourage more investment on green energy. The aforementioned percentage can be of total consumption per month or day or momentary consumption such as per hour or minute or in terms of Watts.

However, as the purpose is to use more environmental friendly resources it would be of interest to use such a selection more actively in the energy consuming system in order to actually achieve a more environmental friendly use.

SUMMARY

One object of the invention is to enable the use of a green energy budget in an energy consuming system.

This object is according to a first aspect achieved by a method for allowing energy consuming devices in a group of energy consuming devices to adapt to green energy consumption. The method is performed by an energy metering device and comprises:

measuring the energy consumption of the group of energy consuming devices, comparing the measured energy consumption with an energy consumption threshold that represents a level below which renewable sources are used for the generation of energy, and indicating to energy consuming devices of the group if the measured energy consumption is on one of the two sides of the energy consumption threshold. Thereby the energy consuming devices are allowed to adapt their energy consumption.

The object is according to a second aspect achieved by an energy metering device for allowing energy consuming devices in a group of energy consuming devices to adapt to green energy consumption. The energy metering device comprises:

a power measurement unit operative to measure the energy consumption of the group of energy consuming devices, and a processor and a memory, where the memory contains instructions executable by the processor through which the energy metering device is configured to compare the measured energy consumption with an energy consumption threshold that represents a level below which renewable sources are used for the generation of energy, and indicate to energy consuming devices of the group if the measured energy consumption is on one of the two sides of the energy consumption threshold. Thereby the energy consuming devices can adapt their energy consumption.

The object is according to a third aspect achieved through a computer program for allowing energy consuming devices in a group of energy consuming devices to adapt to green energy consumption. The computer program comprises computer program code operative to cause an energy metering device, when the computer program code is loaded into the energy metering device, to obtain a measurement of the energy consumption of the group of energy consuming devices, compare the measured energy consumption with an energy consumption threshold that represents a level below which renewable sources are used for the generation of energy, and indicate to energy consuming devices of the group if the measured energy consumption is on one of the two sides of the energy consumption threshold. Thereby the energy consuming devices can adapt their energy consumption.

The object is according to a fourth aspect achieved through a computer program product for allowing a group of energy consuming devices to adapt to green energy consumption. The computer program product comprises a data carrier with computer program code according to the third aspect.

According to a first variation of the first and second aspects, the indicating is made regularly.

According to a second variation of the first aspect, the method further comprises indicating the difference between the measured energy consumption and the energy consumption threshold to the energy consuming devices.

According to a corresponding variation of the second aspect, the energy metering device is further configured to indicate the difference between the measured energy consumption and the energy consumption threshold to the energy consuming devices.

According to a third variation of the first aspect, the method further comprises obtaining a green energy budget indication from an energy supplier and determining the energy consumption threshold based on the green energy budget indication.

According to a corresponding variation of the second aspect, the energy metering device is further configured to obtain a green energy budget indication from an energy supplier and determine the energy consumption threshold based on the green energy budget indication.

According to a fourth variation of the first and second aspects, the indicating of if the measured energy consumption is on one of the two sides of the energy consumption threshold comprises indicating to the energy consuming devices when the measured energy consumption of the group is below the energy consumption threshold.

According to a fifth variation of the first and second aspects, the indicating of if the measured energy consumption is on one of the two sides of the energy consumption threshold comprises indicating to the energy consuming devices when the measured energy consumption of the group is above the energy consumption threshold.

According to a sixth variation of the first aspect, the method further comprises increasing, in at least one energy consuming device, an own energy consumption from an energy saving level to an operational level if the measured energy consumption has changed from above to below the energy consumption threshold.

According to a seventh variation of the first aspect, the method further comprises decreasing, in at least one energy consuming device, an own energy consumption from an operational level to an energy saving level if the measured energy consumption has changed from below to above the energy consumption threshold.

The above mentioned object is according to a fifth aspect also achieved through a method for adapting to green energy consumption in an energy consuming device belonging to a group of energy consuming device associated with an energy metering device. The method is performed in the energy consuming device and comprises receiving, from the power metering device, an indication that the energy consumption of the group is on one of two sides of an energy consumption threshold, where the energy consumption threshold represents a level below which renewable sources are used for the generation of energy, investigating if the energy consumption has crossed the energy consumption threshold, where the investigation comprises investigating received indications, and adjusting the own current energy consumption if the energy consumption is found to have crossed the energy consumption threshold.

The object is according to a sixth aspect achieved through an energy consuming device for adapting to green energy consumption. The energy consuming device belongs to a group of energy consuming devices associated with an energy metering device and comprises:

a processor and a memory, where the memory contains instructions executable by the processor through which the energy consuming device is configured to:

receive, from the power metering device, an indication that the energy consumption of the group is on one of two sides of an energy consumption threshold, where the energy consumption threshold represents a level below which renewable sources are used for the generation of energy, investigate if the energy consumption has crossed the energy consumption threshold, where the investigation comprises investigating received indications, and adjust the own current energy consumption if the energy consumption is found to have crossed the energy consumption threshold.

The object is according to a seventh aspect achieved through a computer program for adapting to green energy consumption in an energy consuming device. The energy consuming device belongs to a group of energy consuming devices associated with an energy metering device. Furthermore, the computer program comprises computer program code operative to cause an energy consuming device, when the computer program code is loaded into the energy consuming device, to receive, from the power metering device, an indication that the energy consumption of the group is on one of two sides of an energy consumption threshold, where the energy consumption threshold represents a level below which renewable sources are used for the generation of energy, investigate if the energy consumption has crossed the energy consumption threshold, where the investigation comprises investigating received indications, and adjust the own current energy consumption if the energy consumption is found to have crossed the energy consumption threshold.

The object is according to an eighth aspect achieved through a computer program product for adapting to green energy consumption in an energy consuming device belonging to a group of energy consuming devices associated with an energy metering device. The computer program product comprises a data carrier with computer program code according to the seventh aspect.

The object is according to a ninth aspect achieved through an energy consuming system for allowing energy consuming devices to adapt to a green energy consumption, where the system comprises an energy metering device according to the second aspect and a group of energy consuming devices of which at least one is an energy consuming device according to the sixth aspect.

In a first variation of the fifth aspect, the method further comprises receiving an indication of the difference between the energy consumption and the energy consumption threshold and the adjusting of the own current energy consumption comprises adjusting the own current energy consumption also based on the difference.

In a corresponding variation of the sixth aspect, the energy consuming device is further configured to receive an indication of the difference between the energy consumption and the energy consumption threshold and to, when adjusting the own current energy consumption, adjust the own current energy consumption also based on the difference.

According to a second variation of the fifth and sixth aspects, possible adjustments of the other energy consuming devices are considered in the adjusting of the own current energy consumption.

According to a third variation of the fifth and sixth aspects, the adjusting of the own current energy consumption comprises decreasing the own energy consumption from an operational energy consuming level to an energy saving level if the energy consumption is found to have risen above the energy consumption threshold.

According to a fourth variation of the fifth and sixth aspects, the adjusting of the own current energy consumption comprises increasing the own energy consumption from an energy saving level to an operational energy consumption level if the energy consumption is found to have fallen below the energy consumption threshold.

The invention has a number of advantages. It enables for energy consuming devices to adapt their energy consumption so that the energy consumption of the whole group is within a green or environmental-friendly budget and thereby it is possible to obtain a more environmental-friendly energy consumption, which may be of general interest for a user, an energy supplier as well as the public. This is thus done for all energy consuming devices in the group and thus also enables energy consuming devices that are not able to make such an adjustment to be energized using environmental-friendly energy sources.

It should be emphasized that the term "comprises/comprising" when used in this specification is taken to specify the presence of stated features, integers, steps or components, but does not preclude the presence or addition of one or more other features, integers, steps, components or groups thereof.

BRIEF DESCRIPTION OF THE DRAWINGS

The invention will now be described in more detail in relation to the enclosed drawings, in which.

DETAILED DESCRIPTION

In the following description, for purposes of explanation and not limitation, specific details are set forth such as particular architectures, interfaces, techniques, etc. in order to provide a thorough understanding of the invention. However, it will be apparent to those skilled in the art that the invention may be practiced in other embodiments that depart from these specific details. In other instances, detailed descriptions of well-known devices, circuits and methods are omitted so as not to obscure the description of the invention with unnecessary detail.

The invention is generally directed towards a system of energy consuming devices connected to a utility grid for consuming of energy. The invention is more particularly directed towards such a system when it is preferred that the energy being consumed is "green" energy, i.e. energy generated by renewable sources, such as water, heat, wind or solar power.

Figure 1:
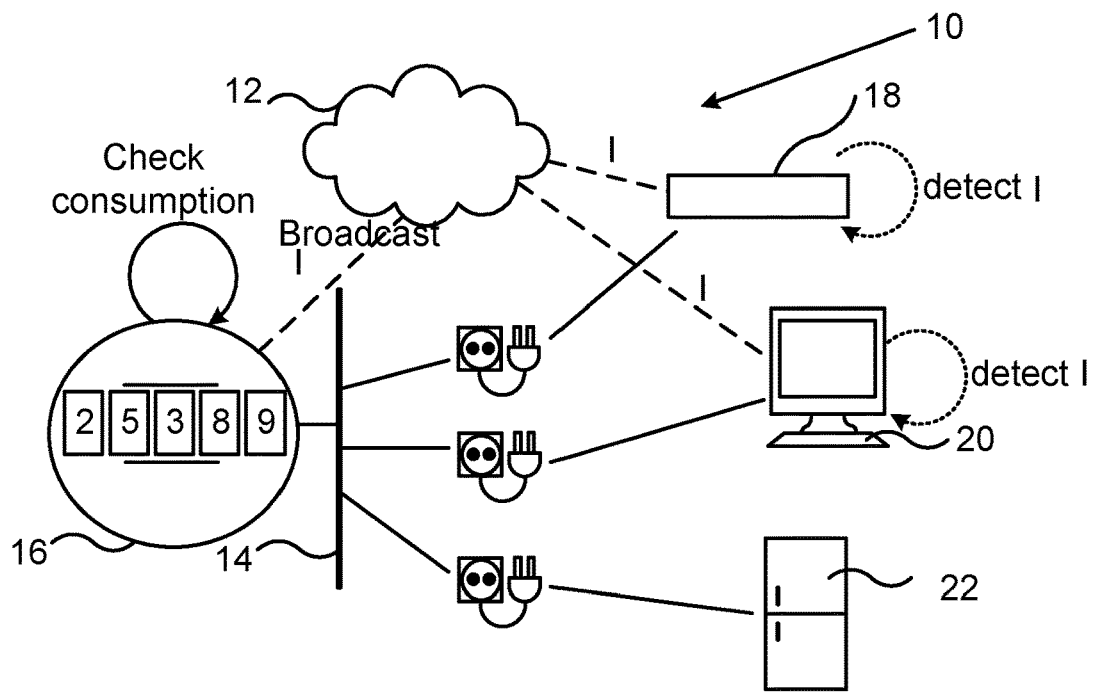
FIG. 1 schematically shows an energy consuming system comprising a number of energy consuming devices and an energy metering device connected to a utility grid as well as a communication network used by the energy metering device for communicating with some of the energy consuming devices.

FIG. 1 schematically shows an energy metering device 16 or power meter that is provided at a power supply location, i.e. a location where power is to be supplied, for instance in relation to a household or an enterprise or office.

For this reason the energy metering device 16 is connected to a utility or electric power grid 14, to which utility grid 14 there is also connected a group of energy consuming devices, where an energy consuming device is a device consuming energy for instance electric energy. There is in the group a first energy consuming device 18, a second energy consuming device 20 and a third energy consuming device 22. The energy consuming devices 18, 20 and 22 may be any type energy consuming device or electrical appliances that are used at some premises such as in a household or an office, such as a television set, a refrigerator, a washing machine, a video player etc. As an example the first energy consuming device 18 may be a video player, the second energy consuming device 20 a television set and the third energy consuming device 22 a refrigerator.

The energy metering device 16 is able to communicate with some of the energy consuming devices in the group. In FIG. 1 it is shown as communicating with the first and second energy consuming devices 18 and 20 using a communication network 12. It is more particularly shown as broadcasting an indication I to the first and second energy consuming devices via this communication network 12. The first and second energy consuming devices 18 and 20 are furthermore shown as detecting the indication I. Because they have this ability they are also termed green energy consuming devices. They may also be considered to be intelligent energy consuming devices. The third energy consuming device 22 does not have this capability and is consequently not green or intelligent. The communication network 12 may be a communication network according to a number of different communication technologies, such as wireless communication or power line communication (PLC) where the electrical power supply network or utility grid is used. Examples of networks in the field of wireless communication are mobile communication networks, such as Global System for Mobile Communications (GSM), Universal Mobile Telecommunications System (UMTS) or Long Term Evolution (LTE) provided according to the $3^{rd}$ Generation Partnership Project (3GPP) or Wi-Fi. Examples of other wireless networks are short-range communication networks such as Bluetooth, Z-Wave or Zigbee networks. It is also possible to use Ethernet.

The energy metering device 16 and the energy consuming devices 18, 20 and 22 furthermore together form an energy consuming system 10, which system is associated with a user, a household, a company or an office. The energy consuming devices 18, 20 and 22 thereby also belong to a group of energy consuming device associated with the energy metering device 16.

Furthermore the energy metering device 16 has the purpose of metering the power or energy consumption of the energy consuming devices at the power supply location, which energy consumption typically is the energy consumption of the different appliances 18, 20 and 22 of the household or enterprise.

Figure 2:
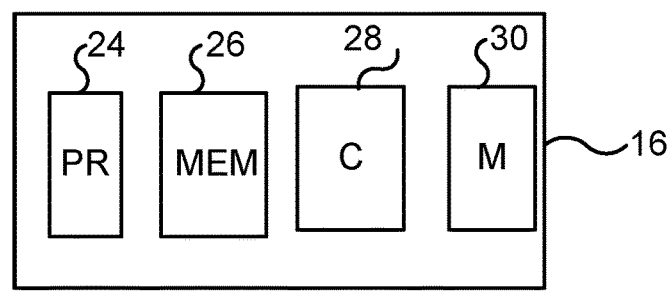
FIG. 2 shows a block schematic of a first way or realizing the energy metering device.

FIG. 2 shows a block schematic of one way of realizing the energy metering device 16. The energy metering device 16 comprises a power metering unit M 30 set to meter the energy consumption of the group of energy consuming devices in the energy consuming system 10. There is also a communication unit C 28 set to communicate according to the communication technology used in the communication system 12. In the case of a wireless communication technology standard it may be a wireless transceiver and in the case of PLC it may comprise a power line modulator/demodulator circuit. The energy metering device 16 also comprises a processor PR 24 connected to a program memory MEM 26. The program memory 26 may comprise a number of computer instructions implementing functionality of the energy metering device 16 related to the previously mentioned indication I and the processor 24 implements this functionality when acting on the instructions. It can thus be seen that the combination of processor 24 and memory 26 implements this functionality provided in relation to the indication I. The type of functionality that is provided will be described later.

Figure 3:
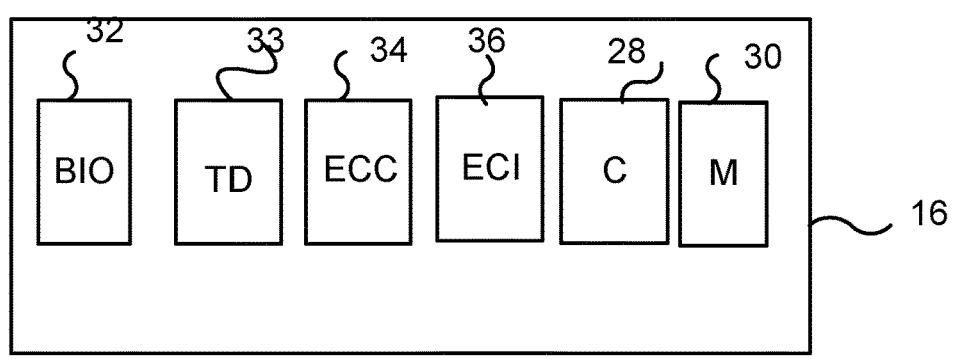
FIG. 3 shows a block schematic of a second way of realizing the energy metering device.

FIG. 3 shows a block schematic of a second way of realizing the energy metering device 16. The energy metering device 16 may comprise a Budget Indication Obtaining unit BIO 32, a Threshold Determining unit TD 33, an Energy Consumption Comparing unit ECC 34 and an Energy Consumption Indication unit ECI 36 in addition to the previously mentioned communication unit 28 and power metering unit 30. Here it can be noted that the budget indication obtaining unit 32 as well as the threshold determining unit 33 are optional. They may be omitted.

The elements in FIG. 3 may be provided as software blocks, for instance as software blocks in a program memory, but also as a part of dedicated special purpose circuits, such as Application Specific Integrated Circuits (ASICs) and Field-Programmable Gate Arrays (FPGAs). It is also possible to combine more than one unit or block in such a circuit.

It should here be realized that the power metering unit may be provided separately from the other units of the power metering device 16.

Figure 4:
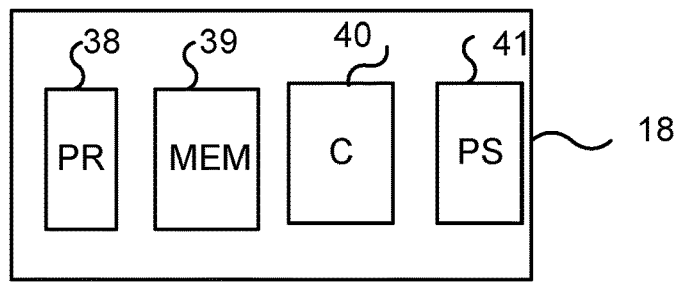
FIG. 4 shows a block schematic of a first way of realizing an energy consuming device t device.

FIG. 4 shows a block schematic of a first way of realizing the first energy consuming device 18. The first energy consuming device 18 comprises a communication unit C 40 set to communicate according to the communication technology used by the communication network 12 and may thereby be a communication unit of the same type as described in relation to FIG. 2. There is also a power source PS 41 used to power the functionality that consumes energy. The power source 41 may be a power supply unit. The first energy consuming device 18 also comprises a processor PR 38 connected to a program memory MEM 39. The program memory 39 may comprise a number of computer instructions implementing functionality of the first energy consuming device 18 related to the reception of the previously mentioned indication I and the processor 38 implements this functionality when acting on the instructions. It can thus be seen that the combination of processor 38 and memory 39 provides this functionality related to the reception of the indication I. The type of functionality that is provided will also in this case be described later.

The first energy consuming device 18 also performs some functionality that consumes energy. It may for instance be the previously mentioned video playing function. Such functionality is typically also provided in the energy consuming device by a function handling unit, where some of it may be implemented also via the memory and processor. Other functionality may require additional units, such as a video player. All these have here been omitted, since the actual functionality performed is not really central.

Figure 5:
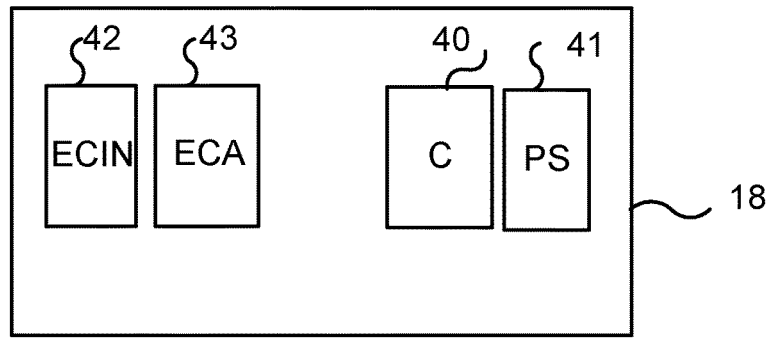
FIG. 5 shows a block schematic of a second way of realizing the energy consuming device.

FIG. 5 shows a block schematic of a second way of realizing the first energy consuming device 18. The first energy consuming device 18 may comprise an Energy Consumption INvestigating unit ECIN 42 and an Energy Consumption Adjusting unit ECA 43 together with the previously mentioned communication unit 40 and power source 41.

The elements in FIG. 5 may also be provided as software blocks, for instance as software blocks in a program memory, but also as a part of dedicated special purpose circuits, such as Application Specific Integrated Circuits (ASICs) and Field-Programmable Gate Arrays (FPGAs). It is also possible to combine more than one element or block in such a circuit.

Here it should be mentioned that also the second energy consuming device 20 may have the same type or similar content as the first energy consuming device 18. However, the actual functionality provided may of course differ.

As mentioned earlier it is possible for a user to choose a percentage of the electricity or a budget that should be green or renewable, meaning it is generated from sources such as solar, wind, rain, tides, waves, geothermal heat, etc. The incentive here is to encourage more investment on green energy. The aforementioned percentage can be of total consumption per month or momentary consumption. This means that a share of the energy being supplied such as a percentage should be environmental friendly. However, unless this information is not used in some way, the energy usage of the user may not be influenced.

Furthermore, even if such a green percentage is chosen it is hard to make this percentage have an impact on the actual operation. Another problem is how to enforce or make sure certain electric devices to use only green energy. The incentive is to encourage people to be more sustainable and device manufacturers to design and manufacture more energy efficient devices.

It would therefore be of interest to use the above mentioned green budget information in order to determine if the energy consumption is environmental-friendly or not. It may also be of interest to use such information in order to influence the way energy is consumed in the energy consuming system. It may for instance be of interest to notify at least some of the energy consuming devices if the energy being consumed is environmental-friendly or not in order for such devices or the user to be able to adapt the energy consumption to become environmental-friendly.

One problem that arises in this context is to solve how to be sure the electricity being used in the energy consuming system is green since from a distribution point of view there is no difference between one type of electricity and another. A simple solution could be to assume that a first X kWh of electricity consumption of a current subscription period is green, and the rest is not. Alternatively it could be assumed that at any moment in time there is a green energy threshold in Watts and any momentaneous consumption above the threshold is not green The present invention is provided for addressing one or more of these issues.

Figure 6:
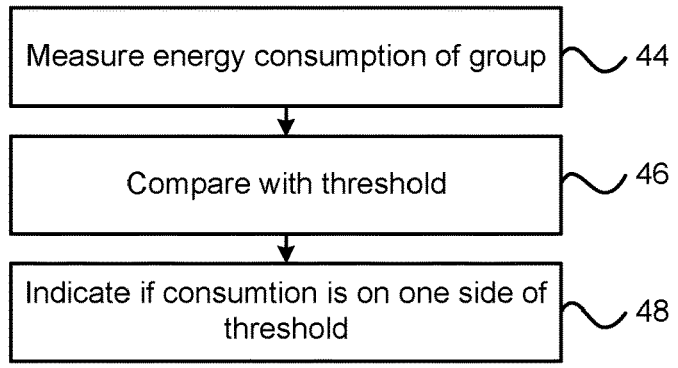
FIG. 6 shows a flow chart of a number of method steps being performed in a first variation of a method for allowing energy consuming devices to adapt to green energy consumption and being performed in the energy metering device.
Figure 7:
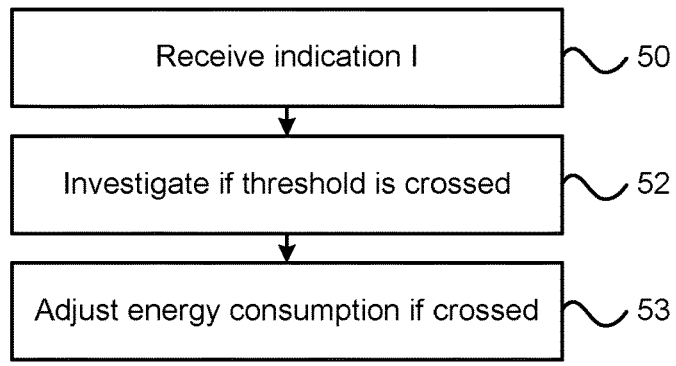
FIG. 7 shows a flow chart of a number of method steps being performed in a first variation of a method for adapting to green energy consumption and being performed in the first energy consuming device.

A first embodiment will now be described with reference also being made to FIG. 6, which shows a flow chart of a number of method steps being performed by the energy metering device 16 in a method for allowing energy consuming devices to adapt to green energy consumption and to FIG. 7, which shows a flow chart of a number of method steps being performed by the first energy consuming device 18 in a method for adapting to green energy consumption.

The energy consumption comparing unit 34 of the energy metering device 16 has an energy consuming threshold. This threshold represents a level, below which renewable sources have been used for the generation of energy consumed by the energy consuming devices in the energy consuming system 10. As mentioned earlier a user may have signed up to a certain degree of the energy consumption being from renewable energy sources, which may be a fixed value or a value that is variable or semi-variable. A certain amount or degree of the energy consumption may thus be from renewable sources and any consumption above that may be from non-renewable energy sources. There may thus be a green energy budget. The budget may be expressed as a total value of energy from renewable sources, which value is valid for a time period such as a year, month or day. As an alternative it may be expressed as a rate value of energy per time unit, such as per hour or minute.

The energy consumption threshold is set based on this green energy budget. In case the budget is fixed or stationary, then the threshold may also be fixed or stationary. In case the budget is variable, then indications of the budget may be repeatedly or regularly received from the operator of the utility or from an energy supplier. In this case the energy consumption threshold may also be variable.

In any event the energy consumption comparing unit 34 thus has an energy consumption threshold, which may be stationary or dynamically updated. A stationary threshold may be pre-determined and can be set without receiving green budget information. The threshold may further be an energy consumption value representing an energy consumption during a certain time period, such as in a day or a month, or an energy consumption rate value, such as the energy consumption per day or hour.

The power metering unit 30 of the energy metering device 16 furthermore measures the energy consumption of the group of energy consuming devices, step 44. It thus measures the energy consumption of the system 10, i.e. the consumption, for instance of electric energy, of the sum of energy consuming devices 18, 20 and 22. This measured energy consumption is furthermore sent to the energy consumption comparing unit 34. The measured energy consumption may be a momentaneous energy consumption like the amount of energy consumed per minute or second. Alternatively the measured energy consumption may be the energy that has been consumed since the start of a measurement period corresponding to the start of the subscription period or the above-mentioned time period, such as from the beginning of the day or month.

The energy consumption comparing unit 34 compares the measured energy consumption with the energy consumption threshold, step 46, and determines on which side of the threshold the energy consumption is located. The result of the comparison is forwarded to the energy consumption indicating unit 36, which in turn indicates to the energy consuming devices in the group if the consumption is on one side of the threshold, step 48. This is done in order to allow them to adapt their energy consumption. It may do this through sending the above-mentioned indication I using the communication unit 28 through the communication network 12, which indication I is sent to energy consuming devices in the group that are able to receive and process the indication. It is thus sent to the green energy consuming devices. The indication I may be a first type of indication used for the side in question. The indication may furthermore be broadcast to all energy consuming devices of the energy consuming system 10. In the present example the energy consuming devices that are able to process the indication are the first and second green energy consuming devices 18 and 20. The third energy consuming device 22 does not have such a capability.

The indication is thus sent to the green energy consuming devices 18 and 20 via the communication network 12. Depending on the communication technology used by the communication network, the indication may be sent using PLC, Ethernet or wireless communication such as mobile communication, WiFi, Bluetooth, Z-Wave or Zigbee.

The indication I is thus a first type of indication, indicating that the measured energy consumption is on one side of the energy consumption threshold, which may be either that it is below the threshold or that it is above the threshold. In case the energy consumption changes so that it crosses the threshold, it is possible to send a second type of indication. In this case it is possible to originally only once send an indication of the first type and then only once send an indication of the second type after the threshold is crossed. As an alternative it is possible that the first type of indication is sent regularly such as with a certain period. In this latter case it is possible that the second indication is sent only once. Alternatively it could also be sent regularly. Another option is that no second type of indication is sent. In this case a crossing of the threshold may be signaled through stopping sending the first type of indication without sending any second type of indication.

The indication I is then received by the green energy consuming devices 18 and 20.

One such energy consuming device is the first energy consuming device 18. There the energy consumption investigating unit 42 receives the one or more indications I via the communication unit 40, step 50. It then investigates if the threshold has been crossed, step 52, which investigation involves investigating the received one or more indications I.

If there is only one type of indication being regularly transmitted by the energy measuring device, then the determining of if the threshold is crossed or not is made based on if the transmission of this indication is stopped being received or not. As long as the indication is received the energy consumption investigating unit 42 determines that the threshold is not crossed. If on the other hand the energy metering device 16 sends two types of indications, then the reception of the second type of indication after the first type will indicate that the threshold has been crossed.

Thereafter, if the threshold is found to or has been deemed to have been crossed, the own current energy consumption is adjusted, step 53. In case the crossing of the threshold involves the use of energy sources that are not green or environmental-friendly, such as use of resources like gas and oil, then it is also possible for the energy consumption investigating unit 42 to signal this to the user, who may then manually lower the energy consumption. As an alternative the results of the investigation are forwarded from the energy consumption investigating unit 42 to the energy consumption adjusting unit 43, which may in turn instruct a function handling unit to adjust the energy consumption of the function performed by the first energy consuming device 18. As an alternative it may itself directly influence the power source 41 to lower the energy consumption. Thereby the first energy consuming device 18 may itself lower the energy consumption. The lowering of the energy consumption may involve going from an operational energy consuming level to an energy saving level such as going into a sleep or standby mode, where a standby mode may be, a low power mode where only certain important functions are enabled. It may even stop working completely, i.e. turn off. It is possible that this change in mode is signaled to the user. Such signaling or warning may include but is not limited to:
- Turning on or flashing a light emitting diode (LED)
- Firing an audible alarm
- Sending a notification via a mobile communication network to a mobile phone of the user.

This type of operation can be made both if the threshold represents a total consumed energy in a time interval as well as an energy consumption rate value.

In case the threshold represents a total consumed energy, then it is not possible to go below the threshold, only rise above it, which may involve going from using only renewable energy sources to using at least some non-renewable energy sources. Therefore the reducing of energy consumption being performed may stay in force for the remainder of the period for which the energy value is valid. Consumption may then be returned to normal at the start of the next period, such as at the beginning of the next day or the next month.

If, on the other hand the threshold is an energy consumption rate then it is possible that the energy consumption also falls below the threshold, so that the energy consumption goes from using at least some non-renewable energy sources to using only renewable or green energy sources.

It is possible for the energy consumption investigating unit 42 to signal the crossing of the threshold when only green energy sources are used to the user. The user may then manually increase the energy consumption from an energy saving level to an operational energy consumption level such as going from a sleep or low power mode to a normal operational mode. As an alternative it is possible that the first energy consuming device 18 itself goes from such a lower power or sleep mode to an ordinary operational mode in case the energy consumption falls below the energy consumption threshold. This may involve the energy consumption adjusting unit 43 informing the above-mentioned function handling unit to adjust the energy consumption of the function performed by the energy consuming device. As an alternative the energy consumption adjusting unit 43 may itself directly influence the power source 41 to increase the energy consumption. It is furthermore possible that also this change in mode is signaled to the user.

The operation was above described in relation to the first energy consuming device 18. A similar type of operation would also be performed by the second energy consuming device 20.

Here it may also be mentioned that it is optionally possible that the green energy consuming devices may consider the operation of each other. There may for instance exist a priority order in which they are to change operational modes. One green energy consuming device may thus change mode first and in case the threshold remains crossed a next green energy consuming device may then change mode. This change may also halt if the consumption again falls below the threshold. The energy consuming devices may also consider the energy consumption of each other in that they may alternate operating in low power modes. They may also have opposite priorities depending on from which direction the threshold is crossed. One energy consuming device may have the highest priority when going into low power mode, but the lowest when returning to the ordinary power mode. Randomization schemes may also be employed for deciding which energy consuming device is to change operational mode.

It is additionally possible that the indication of on which side of the threshold the energy consumption is, is accompanied by an amount with which the consumption differs from the energy consumption threshold. This difference may be used by the energy consuming devices in determining the type of change of operation as well as whether a change of operation is to be made or not. It is for instance possible that normal operation is not resumed in case the consumption has fallen below the threshold with a very small amount.

It can in this way be seen that it is possible for the green energy consuming devices 18 and 20 of the energy consuming system 10 to adapt their energy consumption so that the energy consumption of the system 10 is within a green or environmental-friendly budget and thereby it is possible to obtain a more environmental-friendly energy consumption, which may be of interest to both the user and the operator as well as to the surrounding community in general. This is thus done for the whole system, despite the fact that the third energy consuming devices do not reduce the energy it consumes.

Figure 8:
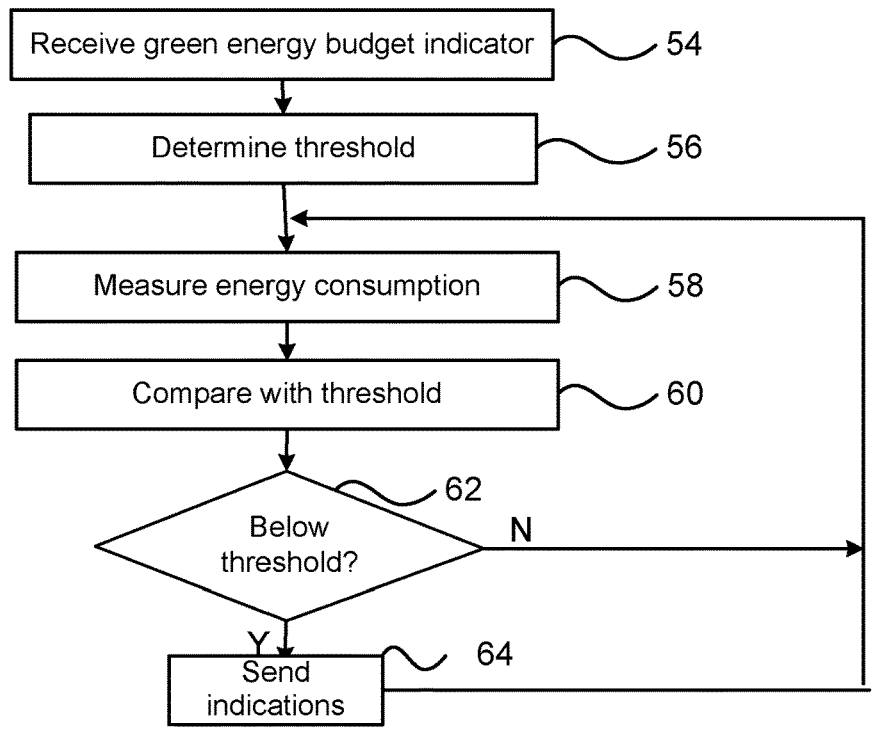
FIG. 8 shows a flow chart of a number of method steps being performed in a second variation of a method for allowing energy consuming devices to adapt to green energy consumption and being performed in the energy metering device.
Figure 9:
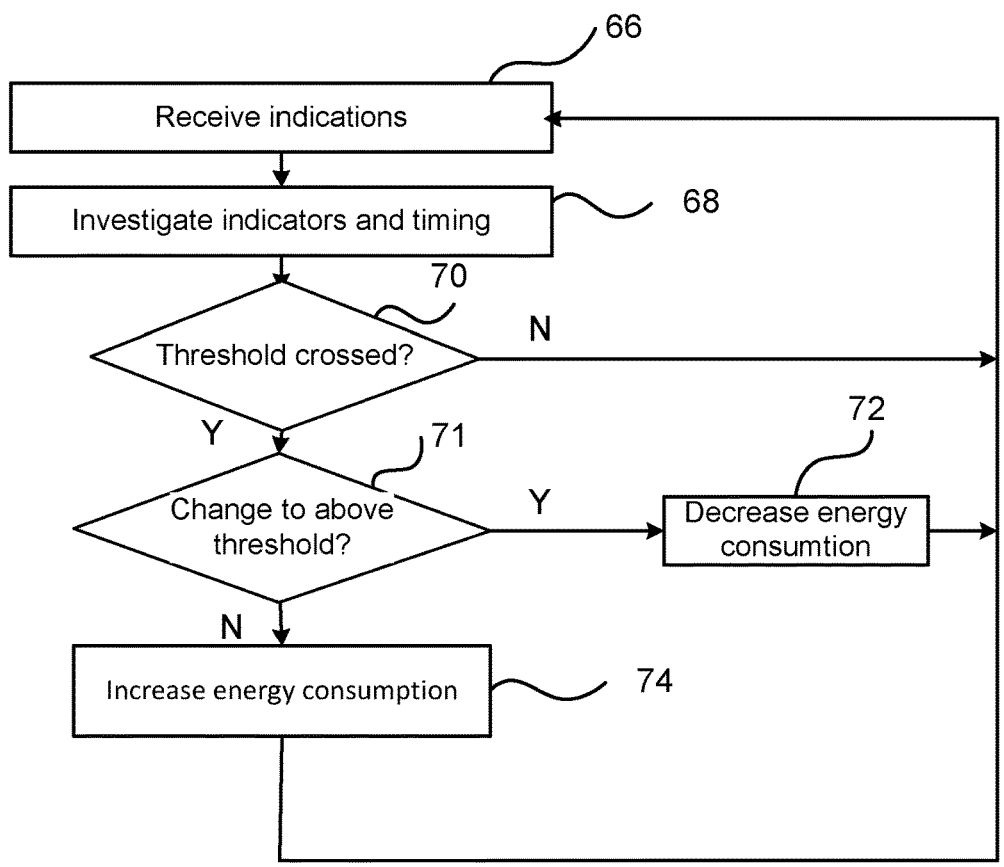
FIG. 9 shows a flow chart of a number of method steps being performed in a second variation of a method for adapting to green energy consumption and being performed in the first energy consuming device.

Now a second embodiment will be described with reference being made to FIG. 8, which shows a flow chart of a number of method steps being performed by the energy metering device 16 in a method for allowing energy consuming devices to adapt to green energy consumption, and to FIG. 9, which shows a flow chart of a number of method steps being performed by the first energy consuming device 18 in a method for adapting to green energy consumption.

In this embodiment the energy supplier provides a green energy budget indicator, which may be an indicator of the green budget, such as an amount of energy delivered that is "green" or environmental-friendly, i.e. generated using renewable sources. The indicator may be an indicator of an amount of power that is "green" in relation to a time period such as a subscription time period. Alternatively it may be a rate of consumption that is "green". A budget value may also be a fixed indication. It may also be a dynamic value that is updated and sent more than one time. A rate may be provided as a delivery of green energy per time unit, such as per hour or per minute.

Such a budget indication may as an example be received by the budget indicator obtaining unit 32 via the communication unit 28 and the communication network 12, step 54. It may especially be received using PLC communication or wireless communication.

Thereafter the threshold determining unit 33 determines the energy consumption threshold based on the green budget indicator, step 56. A budget may here be converted into an allowed amount of energy considered to be green or an energy consumption rate considered to be green. In case the green budget indicator defines an amount of energy valid for a time period a value may be directly set that corresponds to the green budget. In case the green budget indicator is defined as an energy consumption rate, an energy consumption rate threshold may be directly set based on the green budget indicator. If the green budget indicator is in the form of a total amount and the threshold is to be an energy consumption rate, then the energy consumption threshold may be determined based on this amount, for instance as an average energy consumption per time unit within the time period of the subscription.

Also here, the power metering unit 30 of the energy metering device 16 measures the energy consumption of the group of energy consuming devices, step 58, and the measurements are then sent to the energy consumption comparing unit 34.

The energy consumption comparing unit 34 then compares the measured energy consumption with the energy consumption threshold, step 60, and informs the energy consumption indicating unit 36 of the results of the comparison. The energy consumption indicating unit 36 thereafter indicates to green energy consuming devices in the group, step 64, if the consumption is below the threshold, step 62. This means that in this embodiment the one side of the threshold for which a first type of indication is sent, is the side that is lower than the energy consumption threshold. An indication I is in this case sent through the communication network 12 to the green energy consuming devices 18 and 20. The sending is again typically made using the communication unit 28. It may be noted that it is possible that this communication is performed using another communication technique than the one with which the budget indication was received.

If however, the consumption is not below the threshold, step 62, i.e. the energy consumption is higher than the threshold, then the energy consumption indicating unit 36 sends no indication. Thereafter the energy consumption comparing unit 34 may again compare the measured energy consumption with the threshold and the energy consumption indicating unit 36 sends an indication if the consumption is below the threshold and otherwise refrain from sending indications.

As was mentioned in relation to the first embodiment, there may be no further comparison with the threshold when it has been crossed if the threshold represents a total energy consumption.

It can in this way be seen that as long as that the energy consumption is below the threshold an indication I will be regularly or periodically sent. This means that the green energy consuming devices 18 and 20 will know that the energy consumption is below the threshold, as long as indications are received. However as soon as the energy consumption crosses the threshold, then the energy metering device 16 will refrain from sending indications and will keep on avoiding sending indications as long as the consumption stays above the threshold. This means that the absence of indications may be used by the green energy consuming devices to find out that the energy consumption is no longer "green" or environmental-friendly.

It should here be noted that as an alternative it is possible that the second type of indication sent instead, i.e. an indication of when the energy consumption is above the threshold and indications are refrained from being transmitted when the energy consumption is below the threshold.

The indication I is then received by the green energy consuming devices 18 and 20 and especially by the first energy consuming device 18.

There the energy consumption investigating unit 42 receives the one or more indications via the communication unit 40, step 66. It then investigates the indications and the timing or periodicity, step 68, and determines if the threshold is crossed or not, step 70, based on the indications and timing. The results of the investigations are then transferred to the energy consumption adjusting unit 43.

In this case the energy consumption investigating unit 42 determines that energy consumption changes from being below to above the threshold, step 71, if it finds out that indications are stopped being received. If for instance a time corresponding to the timing or period of the indications expires after the last received indication, then the energy consumption may be found to change from below to above the threshold. On the other hand as soon as an indication is received after a time of silence, then the energy consumption investigating unit 42 may directly determine that the energy consumption changes from above to below the threshold.

The determining of if the threshold is crossed or not may thus be made based on if the transmission of the indication is stopped being received or not. As long as the indication is received then the threshold may be deemed not to be crossed.

In case the energy consumption investigating unit 42 found that the energy consumption was found to rise above the threshold, step 71, the energy consumption adjusting unit 43 may decrease the own energy consumption, step 72, such as through going from an ordinary operational mode into a sleep mode, a low power mode or even turn off. Also in this case it is possible to inform an application handling unit or to directly influence the power source 41. It can also here be seen that in case the threshold represents a total energy consumption value, operation would then be stopped until the period for which the threshold is valid has expired. The energy consumption can then not fall below the threshold either.

However, in case the threshold represents an energy consumption rate, it is possible for the measured energy consumption to also fall below the threshold.

In this case if the consumption was found to fall below the threshold, step 71, then the energy consumption adjusting unit 43 may instead increase the energy consumption, step 74, such as through going from a lower power or sleep mode to an ordinary operational mode.

Thereafter reception of indications and the investigation of them is resumed.

Also in this case it is possible that the green energy consuming devices may consider the operation of each other, such as using priorities or randomization.

Furthermore, if the communication network is noisy it is possible that indications are not received properly. In this case it is possible that an indication that is only received in part is still considered as a validly received indication. It is also possible that the time that needs to expire before a crossing of the threshold is determined by the energy consumption investigating unit 42 is several periods long.

It can be seen that when the threshold is set to be a total energy consumption of a time period of the subscription of energy delivery to the energy consuming system, i.e. a first X kWh percentage is assumed to be green, and the rest is not, then the operation may be the following.

1. The energy metering device keeps measuring current total consumption from beginning of current subscription period (typically a month).

2. If the total consumption is still within X kWh, i.e. below the threshold of x kWh, the energy metering device 16 sends the indication, for instance through encoding and broadcasting a digital signature periodically (the same way as heartbeat). The signature itself could be either standardized or an agreement made between the energy measurement device and the green energy consuming devices.

3. The green energy consuming devices will try to detect the signature, and if it is detected, they will continue working in a normal state.

4. If the total consumption is above X kWh, i.e. goes above the threshold, the energy metering device will stop encoding and broadcasting the signature which will then cause the green energy consuming devices to stop working in a normal state because they cannot detect the signature within a predefined time period.

5. After the energy metering device stops encoding and broadcasting the signature, newly plugged in green energy consuming devices will not work in a normal state either.

As mentioned above, instead of broadcasting a signature indication that green energy is still available, the energy metering device can be designed to broadcast a signature only when green energy is not available. The advantage with this approach is that less communication is normally needed.

On the other hand it can be seen that if the threshold is set as an energy consumption rate, such as in Watts rather than total energy consumption over a month in Watts*hour, then the energy metering device is constantly monitoring the threshold in the form of a momentary energy consumption level or energy consumption rate, where the level could be fixed or dynamically updated from external sources like green energy generating company or local solar, wind energy generating systems.

Unlike the previous example where all consumed energy at any given time is considered to be either all green or not at all green (binary information), in this example only part of energy is green, for example if current total consumption is 10 watts, 30% may be green energy.

In this use case it may be of interest to inform the green energy consuming devices about the current green energy budget. In addition to an indication of if the threshold is crossed, for instance in the form of a signature, the energy metering device may send information about how much the current consumption differs from the threshold.

If there is spare capacity of green energy then sleeping green energy consuming devices can turn on (given that additional energy consumption from the green energy consuming devices themselves is within given energy budget). On the other hand if the threshold of consumption is already exceeded then some green energy consuming devices will power off or enter sleep mode.

This embodiment has the advantage in that the energy consuming devices are constantly informed when the energy consumption is "green". They are also informed that the energy consumption is not green through the avoiding of sending indications. This has the advantage that no energy is wasted in the sending of indications when the consumption is not green, while at the same time ensuring that the energy consuming devices are properly informed.

Figure 10:
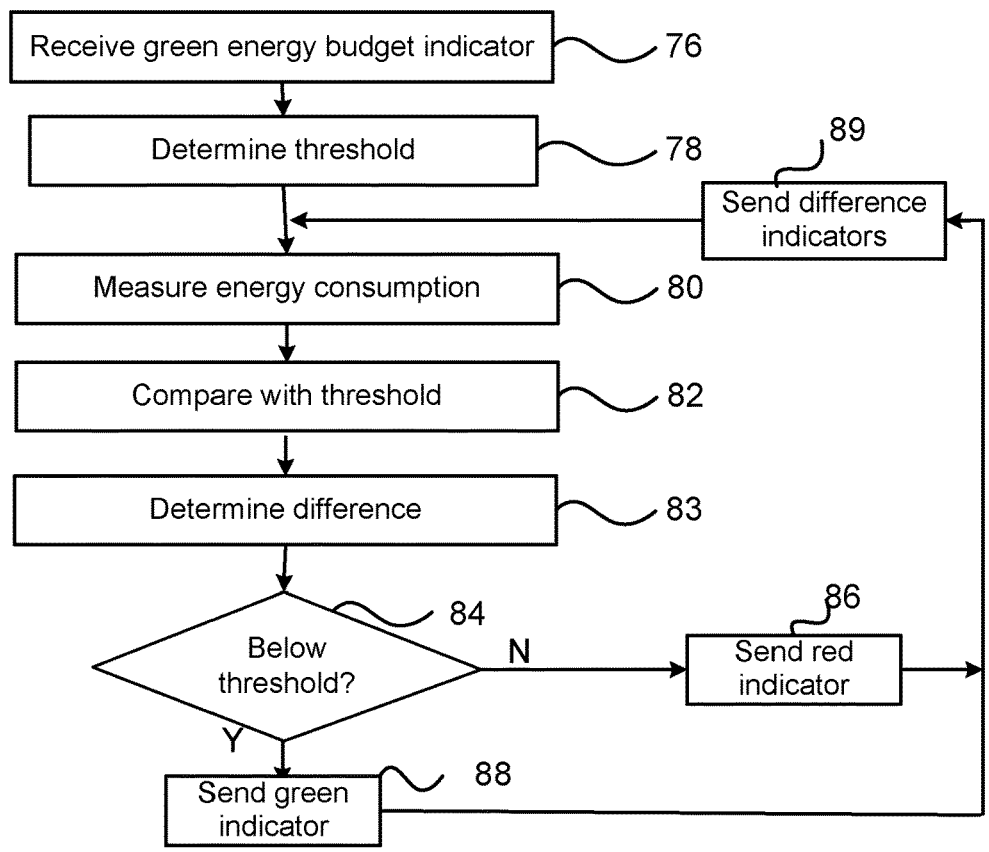
FIG. 10 shows a flow chart of a number of method steps being performed in a third variation of a method for allowing energy consuming devices to adapt to green energy consumption and being performed in the energy metering device.
Figure 11:
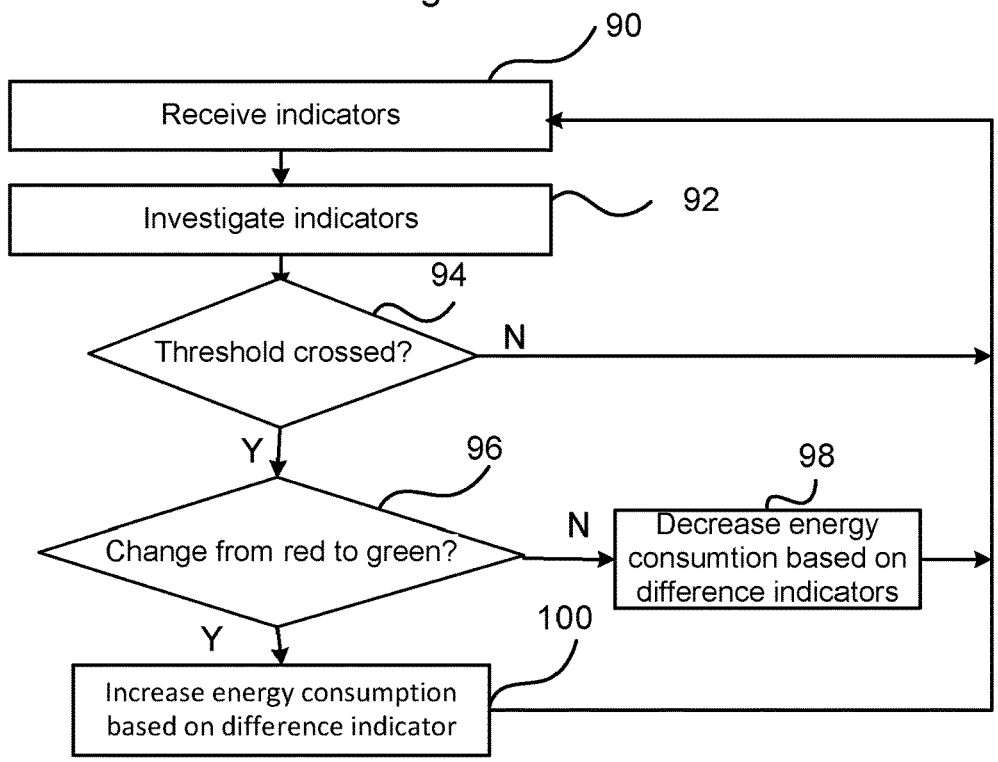
FIG. 11 shows a flow chart of a number of method steps being performed in a third variation of a method for adapting to green energy consumption and being performed in the first energy consuming device.

Now a third embodiment will be described with reference being made to FIG. 10, which shows a flow chart of a number of method steps being performed by the energy metering device 16 in a method for allowing energy consuming devices to adapt to green energy consumption, and to FIG. 11, which shows a flow chart of a number of method steps being performed by the first energy consuming device 18 in a method for adapting to green energy consumption.

Also in this embodiment the energy supplier provides a green energy budget indicator, which maybe an indicator of the green budget, such as a total amount of energy delivered in a supply time interval or subscription time interval that is "green" or environmental-friendly. The budget indicator may as alternative be provided as a momentaneous value, such as an amount of energy delivered per time unit, like per hour or per minute. A budget indicator may furthermore be a dynamic or a semi-dynamic value that is changed over time.

Such a budget indicator may as an example be received by the budget indicator obtaining unit 32 via the communication unit 28 and the communication network 12, step 76. It may especially be received using PLC communication or wireless communication.

Thereafter the threshold determining unit 33 determines the energy consumption threshold, step 78, which in this embodiment may be the determining of a threshold defining a preferred energy consumption rate, like an amount of consumed energy per time unit, such as the energy consumption per minute, which threshold is thus determined based on the received budget indicator. A budget defined as a total energy value may also here be converted into an energy consumption rate. As the budget indicator may be dynamic or semi-dynamic, the threshold may also be recalculated from time to time if the value of the budget indicator changes.

The power metering unit 30 of the energy metering device 16 furthermore measures the momentaneous energy consumption of the group of energy consuming devices, step 80, and the measurements are then sent to the energy consumption comparing unit 34.

The energy consumption comparing unit 34 in turn compares the measured energy consumption with the energy consumption threshold, step 82. It also determines the difference, step 83, i.e. the amount with which the measured energy consumption differs from the energy consumption threshold. Thereafter it informs the energy consumption indicating unit 36 of the results, i.e. of if the energy consumption is above or below the threshold as well as the amount with which the energy consumption is above or below the threshold. The energy consumption indicating unit 36 then indicates to the green energy consuming devices in the group, if the consumption is below the threshold, step 84. This means that in this embodiment a the first type of indication or a "green" indicator is sent if the consumption is below the threshold, step 88, which "green" indicator thus indicates that the energy consumption is green or from a source that is renewable. A green indicator is in this case sent through the communication network 12 to the green energy consuming devices. The sending is again typically made using the communication unit 28.

If however, the consumption is above the threshold, step 84, i.e. the energy consumption is higher than the threshold, then the energy consumption indicating unit 36 sends a second type of indication or a "red" indicator, step 86. This means that if the consumption is above the threshold i.e. that an environmental-friendly consumption can no longer be guaranteed, then an indicator of this fact is sent.

In both cases also an indication of the difference in energy consumption from the threshold is sent, step 89.

Thereafter the energy consumption comparing unit 34 returns and receives energy consumption measurements, compares these with the threshold, step 82, and the energy consumption indicating unit 36 sends a green indication if the consumption is below the threshold. If the energy consumption is above the threshold and the previously sent indicator was a "red" indicator, then it is possible that a "red" indicator is again sent. As an alternative it is possible that the energy metering device 16 in this situation refrains from sending another "red" indicator.

It can in this way be seen that an indication that green energy is used will be regularly or periodically sent as long as the energy consumption is below the threshold. This also means that the energy consuming devices will know that the energy consumption is below the threshold as long as indications are received. However as soon as the energy consumption crosses the threshold and the delivered and consumed energy is no longer all green, then the energy metering device will send one or more red indicators.

The indicators, difference and green or red, are then received by the green energy consuming devices 18 and 20 and especially by the first energy consuming device 18.

There the energy consumption investigating unit 42 receives the one or more indications via the communication unit 40, step 90. It then investigates the indicators, step 92, and determines if the threshold is crossed or not, step 94, based on the type of received indicators.

In this case the energy consumption investigating unit 42 determines that the energy consumption changes from being below to above the threshold through receiving at least one "red" indicator instead of "green" indicators. On the other hand as soon as a green indicator is received directly after a red indicator or after a time of silence, then the energy consuming investigating unit 42 may find that the energy consumption changes from above to below the threshold. The results of the investigation are forwarded to the energy consumption adjusting unit 43.

In case the energy consumption investigating unit 42 determined that that the consumption falls below the threshold, i.e. that there is change from red to green, step 96, then it informs the energy consumption adjusting unit 43, which in turn adjusts the own energy consumption through increasing it, step 100, such as through going from a lower power or sleep mode to an ordinary operational mode. Furthermore in this change also the difference between the energy consumption and the energy consumption threshold as defined by the difference indicator is considered. The change or adjustment of the own energy consumption may be such that the energy consumption adjusting unit 43 ensures that the energy consumption of the group remains below the threshold. On the other hand, if the energy consumption of the system is found to rise above the threshold, the energy consumption adjusting unit 43 adjusts the own energy consumption through decreasing it, step 98, such as through going from an ordinary operational mode into a sleep mode, a low power mode or even turning off all energy consumption, where also here the difference between the energy consumption and the energy consumption threshold as defined by the difference indicator is considered in the change. In case the difference is high. It is for instance possible that the energy consuming device turns itself off.

Also in this case it is possible that the green energy consuming devices may consider the operation of each other, such as using priorities. It is likewise possible to consider the amount of difference from the threshold also here. This can be used to determine the type of energy saving that is to be performed.

Furthermore, also here there may be noise in the communication network so that indicators are not received properly. In this case it is possible that an indicator that is only received in part is considered as a validly received indicator.

This embodiment has the advantage in that the energy consuming devices are constantly informed if the energy consumption is "green". They are also immediately informed when the energy consumption is not green, which allows the fast implementation of countermeasures. If this is done only using one or a few red indicators, the informing is done fast while at the same time avoiding wasting energy for the sending of indications when the consumption is not green.

The third embodiment may be varied in a number of ways. It is for instance possible that difference indicators are omitted.

Figure 12:
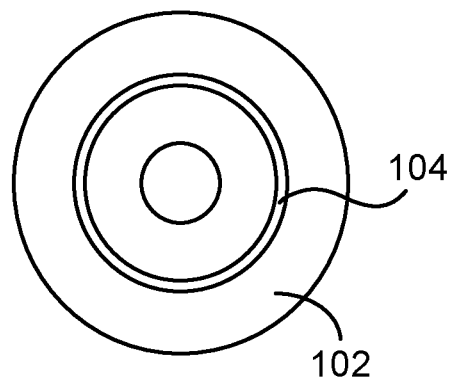
FIG. 12 shows a computer program product comprising a data carrier with computer program code for implementing functionality of the energy metering device.

The computer program code of an energy metering device may be in the form of computer program product for instance in the form of a data carrier, such as a CD ROM disc or a memory stick. In this case the data carrier carries a computer program with the computer program code, which will implement the functionality of the budget indicator obtaining unit, threshold determining unit, energy consumption comparing unit, and the energy consumption investigating unit of the energy metering device. One such data carrier 102 with computer program code 104 is schematically shown in FIG. 12.

Figure 13:
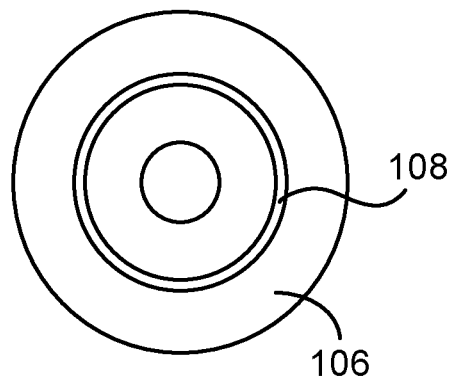
FIG. 13 shows a computer program product comprising a data carrier with computer program code for implementing functionality of the first energy consuming device.

In a similar manner the computer program code of an energy metering device may be in the form of computer program product for instance in the form of a data carrier, such as a CD ROM disc or a memory stick. In this case the data carrier carries a computer program with the computer program code, which will implement the functionality of the energy consumption investigating unit and energy consumption adjusting unit of the energy consuming device. One such data carrier 106 with computer program code 108 is schematically shown in FIG. 13.

In the energy metering device, the power measurement unit may be considered to be means for measuring the energy consumption of the group of energy consuming devices, the energy consumption comparing unit may be considered to be means for comparing the measured energy consumption with an energy consumption threshold and the energy consumption indication unit may considered to be means for indicating to energy consuming devices of the group if the measured energy consumption is on one of the two sides of the energy consumption threshold for allowing them to adapt their energy consumption.

The means for indicating may further be considered to comprise means for indicating the difference between the measured energy consumption and the energy consumption threshold to the energy consuming devices.

The budget indication obtaining unit may furthermore be considered to form means for obtaining a green budget indication from an power energy supplier and the threshold determining unit may be consider to form means for determining the energy consumption threshold based on the green budget indication.

The means for indicating if the measured energy consumption is on one of the two sides of the energy consumption threshold may further comprise means for indicating to the energy consuming devices when the measured energy consumption is below the energy consumption threshold as well as means for indicating to the energy consuming devices when the measured energy consumption is above the energy consumption threshold.

In the first energy consuming device, the communication unit may be considered to comprise means for receiving, from the power metering device, an indication that the energy consumption of the group is on one of two sides of an energy consumption threshold, the energy consumption investigating unit may be considered to be means for investigating if the energy consumption has crossed the energy consumption threshold and the energy consumption adjusting unit may be considered to form means for adjusting the own current energy consumption if the energy consumption is found to have crossed the energy consumption threshold.

The communication unit may further be considered to comprise means for receiving an indication of the difference between the energy consumption and the energy consumption threshold and the means for adjusting the own current energy consumption may be means adjusting the own current energy consumption based on the difference.

The means for adjusting the own current energy consumption may also be considered as comprising means considering possible adjustments of the other energy consuming devices, means for decreasing the own energy consumption from an operational energy consuming level to an energy saving level if the energy consumption is found to have risen above the energy consumption threshold and means for increasing the own energy consumption from an energy saving level to an operational energy consumption level if the energy consumption is found to have fallen below the energy consumption threshold.

While the invention has been described in connection with what is presently considered to be most practical and preferred embodiments, it is to be understood that the invention is not to be limited to the disclosed embodiments, but on the contrary, is intended to cover various modifications and equivalent arrangements. Therefore the invention is only to be limited by the following claims.

The invention claimed is:

1. A method for allowing energy consuming devices in a group of energy consuming devices to adapt to green energy consumption, the method being performed by an energy metering device and comprising:
   measuring the energy consumption of the group of energy consuming devices;
   comparing the measured energy consumption with an energy consumption threshold, said energy consumption threshold representing a level below which renewable sources are used for generation of energy; and
   indicating to one or more energy consuming devices of the group when the measured energy consumption of the group is below the energy consumption threshold and allowing the one or more energy consuming devices of the group to adapt their energy consumption by increasing their energy consumption from an energy saving level to an operational energy consumption level.

2. The method of claim 1, wherein the indicating to the one or more energy consuming devices of the group is made periodically by the energy metering device.

3. The method of claim 1, further comprising indicating the difference between the measured energy consumption and the energy consumption threshold to the one or more energy consuming devices of the group.

4. The method of claim 1, further comprising obtaining a green energy budget indication from an energy supplier and determining the energy consumption threshold based on the green energy budget indication.

5. The method of claim 1, further comprising indicating to the one or more energy consuming devices of the group when the measured energy consumption of the group is above the energy consumption threshold and allowing the one or more energy consuming devices of the group to adapt their energy consumption by decreasing their energy consumption from the operational energy consumption level to the energy saving level.

6. The method of claim 5, further comprising decreasing, in at least one energy consuming device of the group, an own energy consumption from the operational energy consumption level to the energy saving level when the measured energy consumption changes from below to above the energy consumption threshold.

7. The method of claim 1, further comprising increasing, in at least one energy consuming device of the group, an own energy consumption from the energy saving level to the operational energy consumption level when the measured energy consumption changes from above to below the energy consumption threshold.

8. An energy metering device for allowing energy consuming devices in a group of energy consuming devices to adapt to green energy consumption, the energy metering device comprising:
   a power measurement unit operative to measure the energy consumption of the group of energy consuming devices, and
   a processor and a memory, said memory containing instructions executable by said processor whereby said energy metering device is operative to:
     compare the measured energy consumption with an energy consumption threshold, said energy consumption threshold representing a level below which renewable sources are used for generation of energy, and
     indicate to one or more energy consuming devices of the group when the measured energy consumption of the group is below the energy consumption threshold and allowing the one or more energy consuming devices of the group to adapt their energy consumption by increasing their energy consumption from an energy saving level to an operational energy consumption level.

9. The energy metering device according of claim 8, being further operative to indicate the difference between the measured energy consumption and the energy consumption threshold to the one or more energy consuming devices of the group.

10. The energy metering device of claim 8, being further operative to obtain a green energy budget indication from an energy supplier and determine the energy consumption threshold based on the green energy budget indication.

11. The energy metering device of claim 8, further operative to indicate to the one or more energy consuming devices of the group when the measured energy consumption of the group is above the energy consumption threshold and allow the one or more energy consuming devices of the group to adapt their energy consumption by decreasing their energy consumption from the operational energy consumption level to the energy saving level.

12. A method for adapting to green energy consumption in an energy consuming device belonging to a group of energy consuming devices associated with an energy metering device, the method being performed in the energy consuming device and comprising:
   receiving, from the energy metering device, an indication that the energy consumption of the group is above or below an energy consumption threshold, said energy consumption threshold representing a level below which renewable sources are used for generation of energy;
   investigating whether the energy consumption of the group has crossed the energy consumption threshold, said investigation comprising investigating the received indication; and
   adjusting an own current energy consumption from an operational energy consumption level to an energy saving level when the energy consumption of the group is found to have crossed from below to above the energy consumption threshold.

13. The method of claim 12, further comprising receiving a second indication of the difference between the energy consumption of the group and the energy consumption threshold and wherein the adjusting the own current energy consumption comprises adjusting the own current energy consumption based on said difference.

14. The method of claim 12, wherein the adjusting the own current energy consumption is based on adjustments of other energy consuming devices of the group.

15. The method of claim 12, wherein the adjusting comprises increasing the own current energy consumption from the energy saving level to the operational energy consumption level when the energy consumption of the group is found to have fallen below the energy consumption threshold.

16. An energy consuming device for adapting to green energy consumption and belonging to a group of energy consuming devices associated with an energy metering device, the energy consuming device comprising:
   a processor and a memory, said memory containing instructions executable by said processor whereby said energy consuming device is operative to:
   receive, from the energy metering device, an indication that the energy consumption of the group is above or below an energy consumption threshold, said energy consumption threshold representing a level below which renewable sources are used for generation of energy,
   investigate whether the energy consumption of the group has crossed the energy consumption threshold, said investigation comprising investigation of the received indication, and
   adjust an own current energy consumption from an operational energy consumption level to an energy saving level when the energy consumption of the group is found to have crossed from below to above the energy consumption threshold.

17. The energy consuming device of claim 16, being further operative to receive a second indication of the difference between the energy consumption of the group and the energy consumption threshold and to, when adjusting the own current energy consumption, adjust the own current energy consumption based on said difference.

18. The energy consuming device of claim 16, which when adjusting the own current energy consumption is further operative to adjust the own current energy consumption based on adjustments of other energy consuming devices of the group.

19. The energy consuming device of claim 16, which when adjusting the own current energy consumption is further operative to increase the own current energy consumption from the energy saving level to the operational energy consumption level when the energy consumption of the group is found to have fallen below the energy consumption threshold.

* * * * *